(12) United States Patent
Kirchner et al.

(10) Patent No.: US 7,522,260 B1
(45) Date of Patent: Apr. 21, 2009

(54) METHOD FOR CORRECTING ASTIGMATISM IN A MICROLITHOGRAPHY PROJECTION EXPOSURE APPARATUS, A PROJECTION OBJECTIVE OF SUCH A PROJECTION EXPOSURE APPARATUS, AND A FABRICATION METHOD FOR MICROPATTERNED COMPONENTS

(75) Inventors: Andreas Kirchner, Bebingen (DE); Hans-Juergen Mann, Oberkochen (DE); Bernhard Kneer, Altheim (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 11/239,266

(22) Filed: Sep. 29, 2005

Related U.S. Application Data

(60) Provisional application No. 60/614,184, filed on Sep. 29, 2004.

(51) Int. Cl.
*G03B 27/68* (2006.01)
*G02B 5/10* (2006.01)
(52) U.S. Cl. ......................... 355/52; 359/859
(58) Field of Classification Search ................... 355/52, 355/39, 66; 378/34; 369/44.23; 359/366, 359/731, 859
See application file for complete search history.

(56) References Cited

U.S. PATENT DOCUMENTS 6,188,513 B1 * 2/2001 Hudyma et al. ............. 359/366
6,549,270 B1  4/2003 Ota .............................. 355/55
7,170,831 B2 * 1/2007 Takiguchi et al. .......... 369/44.23
2004/0263810 A1 12/2004 Kirchner et al. .............. 355/52

FOREIGN PATENT DOCUMENTS

DE          100 37 870       2/2002
EP          1 039 510        9/2000
WO          WO 02/056114  *  7/2002

OTHER PUBLICATIONS

Chapman and Sweeney: "A Rigorous Method for Compensation Selection and Alignment of Microlithographic Optical Systems", SPIE vol. 3331, pp. 102-133 (1998).

(Continued)

*Primary Examiner*—Hung Henry Nguyen
*Assistant Examiner*—Chia-how Michael Liu
(74) *Attorney, Agent, or Firm*—St. Onge Steward Johnston & Reens LLC

(57) ABSTRACT

A method for correcting a field-constant astigmatism of a projection objective of a microlithography projection exposure apparatus, the projection objective having an arrangement composed of a plurality of optical elements that images at least a part of an object onto an off-axis image field lying outside at least one optical axis, the arrangement of the plurality of optical elements having a plane of symmetry that is defined by the at least one optical axis and a center of the image field, includes adjusting a position of at least one element of the plurality of optical elements in such a way that at least one linear and/or quadratic astigmatism is produced that compensates the field-constant astigmatism at least partially. A projection objective of a projection exposure apparatus, as well as a microlithographic method for producing micropatterned components uses the method.

25 Claims, 7 Drawing Sheets

OTHER PUBLICATIONS

Descour et al.: "Misalignment modes in high-performance optical systems", Opt. Eng. vol. 39(7) pp. 1737-1747 (Jul. 2000).

C. Hofmann et al., Nanometer-Asphären: "Wie herstellen und wofür?", Feinwerktechnik & Messtechnik vol. 99 pp. 437-439 (1991).

D. M. Williamson et al.: "compensator selection in the tolerancing of a microlithographic lens", SPIE vol. 1049, pp. 178-186 (1989).

J. Braat: Quality of microlithographic projection lenses, SPIE vol. 811, pp. 22-30 (1987).

* cited by examiner

METHOD FOR CORRECTING ASTIGMATISM IN A MICROLITHOGRAPHY PROJECTION EXPOSURE APPARATUS, A PROJECTION OBJECTIVE OF SUCH A PROJECTION EXPOSURE APPARATUS, AND A FABRICATION METHOD FOR MICROPATTERNED COMPONENTS

PRIOR APPLICATION

The present application claims priority of U.S. Provisional Application No. 60/614,184 filed on Sep. 29, 2004.

BACKGROUND OF THE INVENTION

The invention relates in general to the field of microlithography.

The invention relates in this field to a method for correcting a field-constant astigmatism of a projection objective of a microlithography projection exposure apparatus.

The invention also relates to a projection objective of a microlithography projection exposure apparatus.

The invention also relates to a method for the microlithographic production of micropatterned components and to a micropatterned component produced in such a way.

Micropatterned components, for example highly integrated electric circuits, are produced microlithographically in the semiconductor industry.

For this purpose, at least one layer made from a light-sensitive material, for example a photoresist, is applied to a substrate, for example a silicon wafer. The substrate thus coated is subsequently exposed in a projection exposure apparatus. During exposure, an object, a reticle, provided with an appropriate patterning is imaged with the aid of a projection objective onto the light-sensitive layer. After the development of the photosensitive layer, the substrate is subjected to an etching or deposition process, as a result of which the uppermost layer is patterned on the reticle in accordance with the pattern. The still remaining part of the light-sensitive layer is then removed. This process is repeated until all the layers are applied to the substrate.

Because of the steadily rising demands being made on the integration density of micropatterned components, it is necessary to apply to the substrate microfeatures whose dimensions are becoming ever smaller. Since the resolution is proportional to the wavelength of the projection light, the tendency is toward smaller wavelengths of the exposure light. At present, use is already being made of light in the deep ultraviolet (DUV) and even in the extreme ultraviolet (EUV) spectral region, the latter spectral region lying at about 13 nm. Since there are no materials that are still sufficiently transparent in such a spectral region, projection objectives for the EUV region are constructed from reflective optical elements. Such a reflective microlithography projection objective is described in document DE 100 37 870 A1. The projection objective described there has six mirrors as optical elements.

With the rising demands placed on the resolution of the microfeatures to be imaged, aberrations caused by the projection objective are increasingly posing a problem.

Astigmatism is an aberration the at least partial correction of which is the subject matter of the present invention.

In the case of astigmatism, an object point lying on the optical axis is not imaged in a punctiform fashion by the projection objective. If a beam emanating from an off-axis object point and impinging obliquely on an optically imaging element is decomposed into such rays as lie in the so-called meridian plane that is defined by the optical axis and the principal ray of the beam, and into such rays as lie in the so-called sagittal plane, in which the principal ray likewise lies but which runs perpendicular to the meridian plane, it is observed that the meridian rays have a different focus than the sagittal rays. The difference between the two foci of the meridian rays and the sagittal rays is denoted as the astigmatic difference. In the case of an object pattern that is formed, for example, from two mutually perpendicular lines, one line is sharply imaged in a specific image plane by an astigmatic element, while the other line is unsharp or blurred in this image plane, and the relationships are precisely the other way round in another image plane spaced apart from the first image plane. Thus, there is no image plane in which the two lines can simultaneously be sharply imaged and, in the case of a projection objective this leads to a loss of imaging accuracy because of the complexity of the features to be imaged.

In the case of so-called field-constant astigmatism, which is also denoted as on-axis-astigmatism, the aberration caused by astigmatism is constant when seen over the image field, that is to say it is not dependent on the spatial coordinate of the image field. The cause of astigmatism can lie, for example, in fabrication errors of the surfaces or of the material (for example an inhomogeneous refractive index for objectives with refractive elements) of the optical elements, in deformations of optical elements owing to external forces or torques that are caused by nonideal mounts or screw joints and their assembly, in non-uniform thermal expansions of near-pupil optical elements during operation (for example owing to radiation with light) and/or in a nonuniform degradation of the material of the optical elements during use of the projection objective. In the case of objectives with refractive elements, the refractive index can change owing to radiation with light, for example.

A field-constant astigmatism is observed, inter alia, in the case of lithography optics of rotationally symmetrical design. Lithography optics of rotationally symmetrical design are those which exhibit rotational symmetry with reference to at least one optical axis, and image an object onto a circular full image field centered with reference to the optical axis.

If a projection objective includes rotationally symmetrical optical elements whose surface has a deformation with two-fold symmetry, an attempt can be made during the adjustment to rotate one or more optical elements by large angles about the optical axis, which is also denoted as clocking. This is described, for example, in the article by David M. Williamson entitled "Compensator Selection in the Tolerancing of a Microlithographic Lens", in SPIE "Recent Trends in Optical Systems Designs II", vol. 1049, 1989, pages 178-186.

Field-constant astigmatism occurs, however, not only with rotationally symmetrical projection objectives, but also in the case of projection objectives that image an object or a part of an object onto only a partial annular image field that is off-axis, that is to say lies outside the optical axis. Such projection objectives are denoted as not rotationally symmetrical. Such a projection objective is the projection objective in accordance with document DE 100 37 870 A1 already mentioned above.

Such not rotationally symmetrical projection objectives typically have mirror symmetry with reference to a plane of symmetry that is defined by at least one optical axis and the center of the image field.

Unlike the rotationally symmetrical projection objectives, because of the lack of rotational symmetry with such a projection objective the field-constant astigmatism cannot be corrected by clocking.

Moreover, with rotationally symmetrical projection objectives an attempt may be made to deform at least one surface of an optical element in order to correct the astigmatism if clocking has not resulted in the success desired. However, since the field-constant astigmatism can vary with time during operation of the projection objective, such a deformation requires an actively deformable optics, and this is associated with a substantial level of structural complexity, and thus with a high outlay on cost.

Since clocking does not generally constitute a solution to the correction of astigmatism in the case of not rotationally symmetrical projection objectives, the only possibility left would be to provide an actively deformable optics in general, with the disadvantage of the very high technical requirements with reference to accuracy of setting, operational stability and high costs.

SUMMARY OF THE INVENTION

It is an object of the present invention to provide a method with the aid of which it is possible to correct field-constant astigmatism with the least possible outlay in the case of a non-rotationally symmetrical projection objective.

It is further an object of the present invention to provide a not rotationally symmetrical projection objective that renders it possible to correct field-constant astigmatism.

It is a further object of the present invention to provide a method for the microlithographic fabrication of micropatterned components that is improved with regard to its accuracy of application.

In accordance with a first aspect of the invention, a method is provided for correcting a field-constant astigmatism of a projection objective of a microlithography projection exposure apparatus, the projection objective having an arrangement of a plurality of optical elements that images at least a part of an object onto an off-axis image field lying outside at least one optical axis, the arrangement of the plurality of optical elements having a plane of symmetry that is defined by at least one optical axis and a center of the image field. The correction of the field-constant astigmatism comprises an adjustment of the position of at least one element of the plurality of optical elements in such a way that at least one linear and/or quadratic astigmatism is produced that at least partially compensates the field-constant astigmatism.

The invention is based on the finding that linear astigmatism and field-constant astigmatism, in particular, are similar in an off-axis partial annular image field. According to the invention, by adjusting the position of at least one of the optical elements in the off-axis field region of the image field a linear and/or quadratic astigmatism are/is induced which is directed opposite to the field-constant astigmatism and can therefore at least partly compensate the latter. The correction of a field-constant astigmatism by means of adjusting the position of single optical elements or a number thereof has the advantage that there is no need for an actively deformable optics when the field-constant astigmatism changes with time during operation. The adjustment of the position of single optical elements or a number thereof constitutes a mechanism for correcting field-constant astigmatism that is simple even during operation of the projection objective.

The basic idea of the invention of being able to correct aberrations on a narrow, off-axis image field by producing other aberrations that are similar to the aberrations to be corrected on the narrow, off-axis image field can also be used advantageously to correct other aberrations such as coma or distortion or spherical aberration.

In simple and preferred embodiments of the method, adjusting the position of the at least one element in order to produce linear astigmatism comprises tilting about a tilting axis that runs approximately perpendicular to the plane of symmetry, and/or a parallel displacement of the at least one element along at least one axis that lies in the plane of symmetry. These measures can be used, in particular, to induce a linear astigmatism that is symmetrical with reference to the plane of symmetry for the purpose of compensating the one symmetrical field-constant astigmatism.

If an asymmetric field-constant astigmatism is to be corrected, it is preferred to produce an asymmetric linear astigmatism, particular preferably by parallel displacement of at least one element along an axis that runs at least approximately perpendicular to the plane of symmetry, and/or by tilting at least one element about a tilting axis that runs at least approximately perpendicular to the optical axis and runs at least approximately in the plane of symmetry.

It can preferably be provided for the purpose of further improving the correction of field-constant astigmatism to additionally produce a quadratic astigmatism by adjusting the position of at least one optical element and/or of the object in the off-axis field region.

This is preferably implemented by a parallel displacement of at least one element parallel to the optical axis.

Furthermore, the method according to the invention can be refined by selecting the element whose position is to be adjusted, this preferably being done by adjusting the position of near-field or near-pupil elements, or a combination of such, in order to achieve the highest possible degree of correction of the field-constant astigmatism.

In accordance with a further aspect of the invention, a method is provided for the microlithographic production of micropatterned components which has the steps of:
  providing a substrate to which there is applied at least partially a layer made from a light-sensitive material;
  providing a reticle that has features to be imaged;
  providing a projection exposure apparatus that has a projection objective;
  measuring the astigmatism of the projection objective;
  correcting a field-constant astigmatism of the projection objective by means of the correction method according to the invention; and
  projecting at least a part of the reticle onto a region of the layer of the substrate by means of the projection exposure apparatus.

In accordance with yet a further aspect of the invention, a micropatterned component fabricated as previously described is provided.

In accordance with yet a further aspect of the invention, provision is made of a projection objective of a microlithography projection exposure apparatus, having an arrangement composed of a plurality of optical elements that serves the purpose of imaging at least a part of an object onto an off-axis image field lying outside at least one optical axis, in which the arrangement of the plurality of optical elements has a plane of symmetry that is defined by the at least one optical axis and a center of the image field. At least one element of the plurality of optical elements is assigned at least one actuator for adjusting the position of the at least one element in such a way that at least one linear and/or quadratic astigmatism can be produced in order to compensate field-constant astigmatism in the off-axis field region.

The projection objective according to the invention requires no actively deformable optics for correcting the field-constant astigmatism, but has only actuators for adjusting the position of one or more of the optical elements in order to correct the astigmatism, as was mentioned in conjunction with the above-named method.

BRIEF DESCRIPTION OF THE DRAWINGS

Further advantages and features emerge from the following description of a few selected exemplary embodiments of the invention that are illustrated in the attached drawings and described hereafter in more detail with reference to said drawings, in which.

DETAILED DESCRIPTION OF PREFERRED EXEMPLARY EMBODIMENTS

Figure 1:
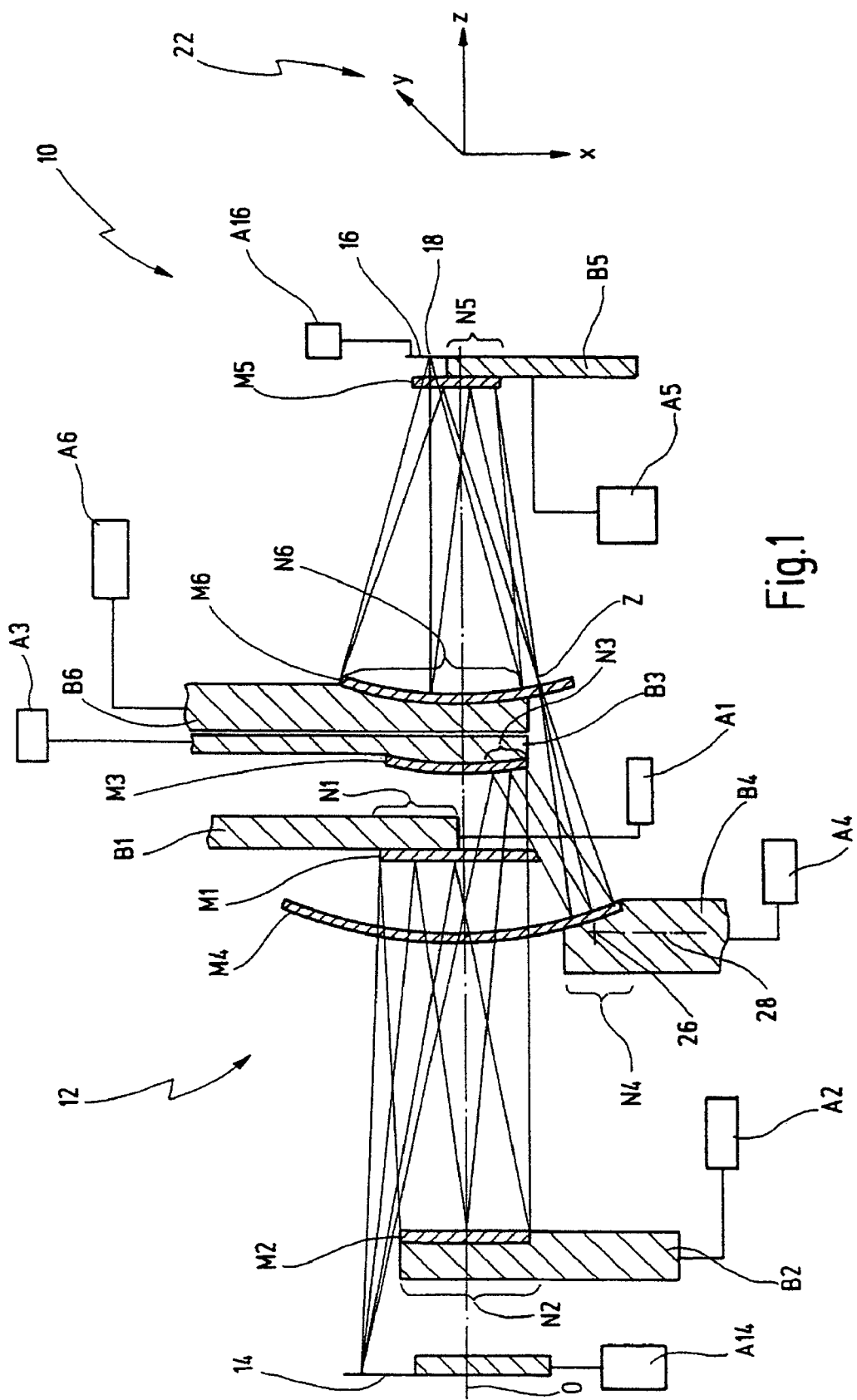
FIG. 1 shows a partial schematic of a projection exposure apparatus in the region of a projection objective.

A microlithography projection exposure apparatus provided with the general reference numeral 10 is illustrated in FIG. 1 in the region of a projection objective 12. Further components of the projection exposure apparatus 12 such as, for example, the light source or the illumination system between the light source and the projection objective 10 are not illustrated.

The projection exposure apparatus 10 preferably operates in the EUV spectral region at a wavelength of 13 nm.

A pattern (not illustrated in more detail) of an object 14 that is arranged in an object plane and denoted in microlithography as a reticle is imaged by means of the projection objective 12 onto a substrate 16 that is coated with a light-sensitive material and is also denoted as a wafer in microlithography. The substrate 16 is located in the image plane of the projection objective 12.

The projection objective 12 has a plurality of optical elements in the form of mirrors M1, M2, M3, M4, M5, M6. The projection objective 12 illustrated by way of example is therefore a six-mirror projection objective. The enumeration of the mirrors M1 to M6 is selected in accordance with the course of the beam path of the light, starting from the object 14 toward the substrate 16. The projection objective 12 illustrated here by way of example corresponds, in particular, to the projection objective in accordance with the document DE 100 37 870 A1.

The arrangement of the mirrors M1 to M6 has an optical axis O. With the exception of the mirror M2, the individual useful regions N1 to N6 of the mirrors M1 to M6 are not rotationally symmetrical with reference to the optical axis O. The mirrors M1 to M6 are certainly illustrated in a rotationally symmetrical fashion in FIG. 1 with reference to the optical axis O, but in practice the mirrors M1 to M6 of the projection objective 12 extend only over their respective useful region N1 to N6 while, by contrast with the illustration in FIG. 1, they are not present outside their useful regions N1 to N6, in order not to impede the beam path of the light.

Figure 1A:
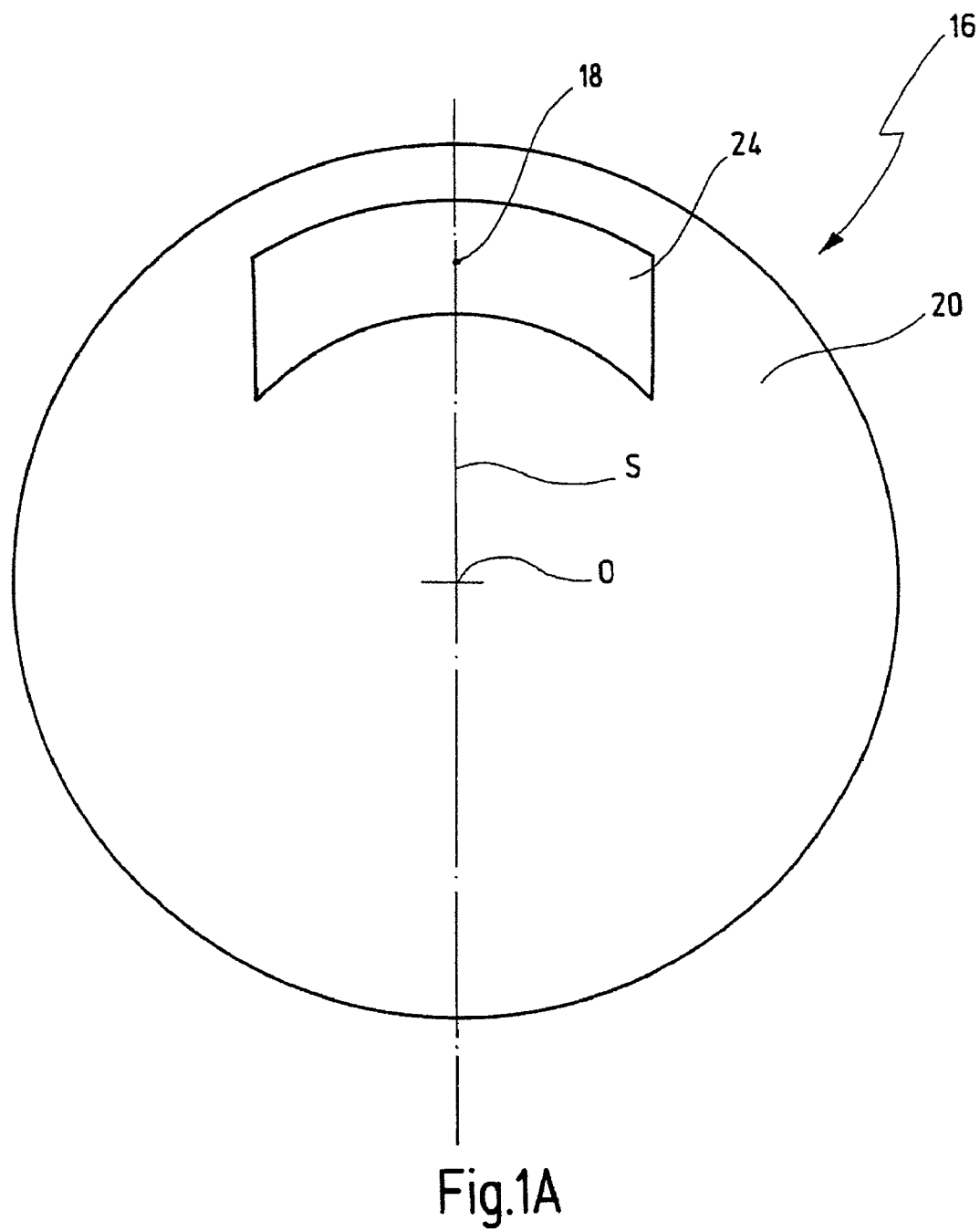
FIG. 1A shows a schematic of an image field of the projection objective of the projection exposure apparatus in FIG. 1.

The projection objective 12 has mirror symmetry with reference to the plane of symmetry S that is defined by the optical axis O and a center 18 of an image field 24 (FIG. 1A). In FIG. 1, this plane of symmetry S is the plane of the drawing. Furthermore, FIG. 1 illustrates a Cartesian coordinate system 22 whose z-axis coincides with the optical axis O. The previously mentioned plane of symmetry S is the x-z plane of the coordinate system 22.

The mirrors M1 to M6 are arranged on base elements B1 to B6 assigned to the respective mirrors M1 to M6. In addition to a supporting function, the base elements B1 to B6 may also fulfill further functions, for example ensure stabilization of the temperature of the mirrors M1 to M6. In particular, as further described below the base elements B1 to B6 fulfill the function of adjusting the position of the individual mirrors M1 to M6.

As illustrated schematically in FIG. 1A, the projection objective 12 images the object 14 or a part of the object 14 not onto a circular full image field 20 centered with reference to the optical axis, but only onto a narrow image field 24 that is off-axis, that is to say lies outside the optical axis O, and essentially takes the form of a section of a ring.

A distinction is made between near-field and near-pupil mirrors in the case of the mirrors M1 to M6.

Denoted as near-field mirrors are those from mirrors M1 to M6 that are situated near a field plane of the projection objective 12, that is to say near the object 14, near the image 16 or the intermediate image Z. In the present exemplary embodiment, the mirrors M1, M3 and M4 are near-field mirrors.

Near-pupil mirrors are those that are situated near a pupil plane of the projection objective 12. These are the mirrors M2, M5 and M6 in the exemplary embodiment shown.

At least one of the mirrors M1 to M6, preferably all the mirrors M1 to M6, are equipped with at least one degree of freedom of the positional adjustment.

The possible degrees of freedom of the adjustment of the position of the mirrors M1 to M6 include the following:

tilting about a tilting axis perpendicular to the plane of symmetry. Such a tilting axis is depicted for the mirror M4, by way of example and provided with the reference numeral 26;

a parallel displacement along at least one axis in the plane of symmetry. Such an axis is depicted for the mirror M4 and provided with the reference numeral 28. However, the axis 28 can also have another orientation in the plane of symmetry (x-z plane);

tilting about a tilting axis that runs perpendicular to the optical axis O and lies in the plane of symmetry (x-z plane). The axis 28 is such a tilting axis for the mirror M4, for example; and a parallel displacement along at least one axis perpendicular to the plane of symmetry (x-z plane). Such an axis is, for example, the tilting axis 26 of the mirror M4.

All of the mirrors M1 to M6 and the object 14 and, if appropriate, also the image and/or the substrate 16 are preferably equipped with the degrees of freedom previously mentioned.

In accordance with FIG. 1, each of the mirrors M1 to M6 is correspondingly assigned an actuator A1 to A6 with the aid of which the positional adjustments can be controlled in accordance with the previously mentioned degrees of freedom. An actuator A14 is correspondingly assigned to the object 14, and an actuator A16 is correspondingly assigned to the image 16.

Because of deformations induced by fabrication or resulting during operation of the projection objective 12 and found in individual mirrors or a number of mirrors M1 to M6, the projection objective 12 can exhibit in the image field 24 field-constant astigmatism that is corrected in accordance with the method to be described below.

The first step is to describe with reference to FIGS. 2 and 3 the phenomenon of a field-constant astigmatism and its correction by means of a consciously induced linear and/or quadratic astigmatism.

Figure 2A:
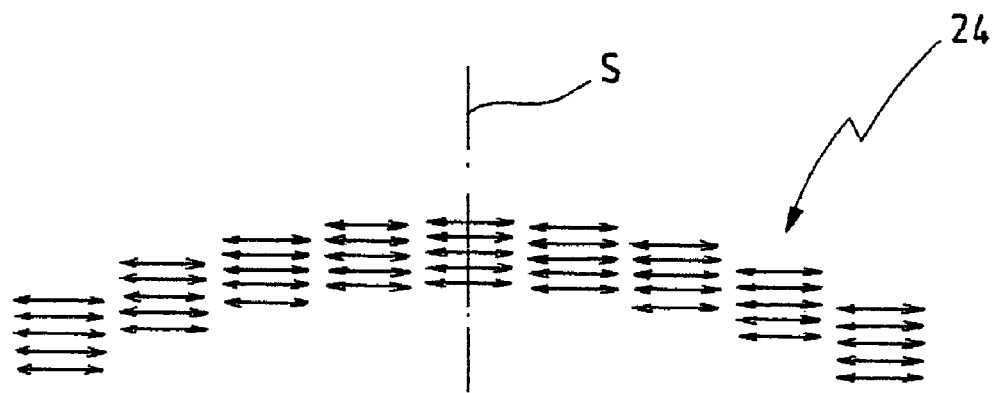
FIG. 2a)) to c) show schematically and by way of example idealized field profiles of a symmetrical constant astigmatism (FIG. 2a)), of a quadratic astigmatism (FIG. 2b)) and of a linear symmetrical astigmatism (FIG. 2c)) within an off-axis image field.

FIG. 2a) shows the image field 24 on its own. An idealized 0° astigmatism that is field-constant with reference to the plane of symmetry is illustrated by means of arrows in FIG. 2a).

The orientation of the arrows in FIG. 2a) specifies the orientation of a pattern to be imaged in each case at a field point that is most strongly affected by the astigmatism. Thus, by way of example this is a horizontal pattern in FIG. 2a), and this astigmatism is therefore denoted as 0° astigmatism. If the pattern for the object 14 that is to be imaged comprises a vertical and a horizontal line, the horizontal line is not sharply imaged in the image plane of the image 16 in FIG. 1, but is defocused. The length of the individual arrows in FIG. 2a) specifies how strong the defocusing is, that is to say how far the substrate 16 must be displaced in order to image the horizontal line sharply. The length of the arrows in FIG. 2a) is normalized to 1.

A field-constant astigmatism is spoken of here since the orientation of the arrows in FIG. 2a) and their length over the entire off-axis field region 24 is constant.

It is also to be seen in FIG. 2a) that the astigmatism illustrated there is symmetrical with reference to the plane of symmetry S.

Figure 2B:
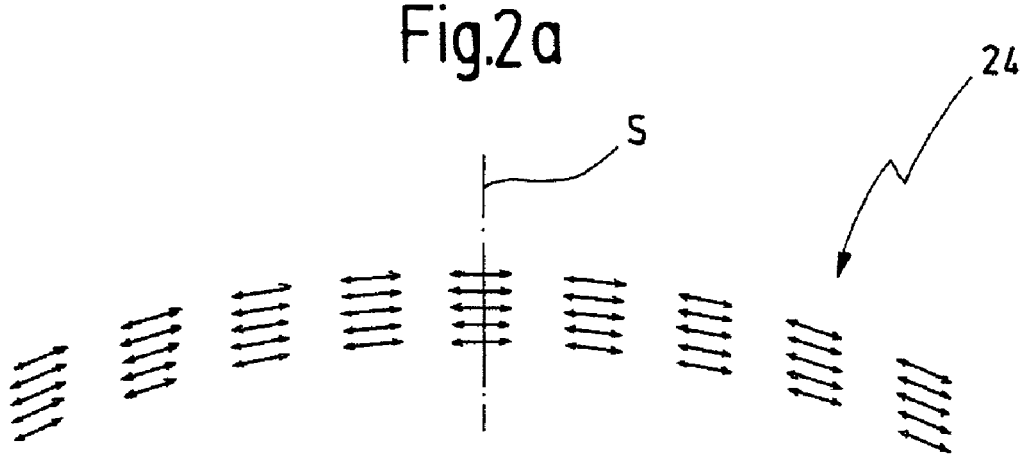

Illustrated in FIG. 2b) is a quadratic astigmatism that increases quadratically with increasing distance from the optical axis. The maximum value of the quadratic astigmatism is normalized to 1 again.

Figure 2C:
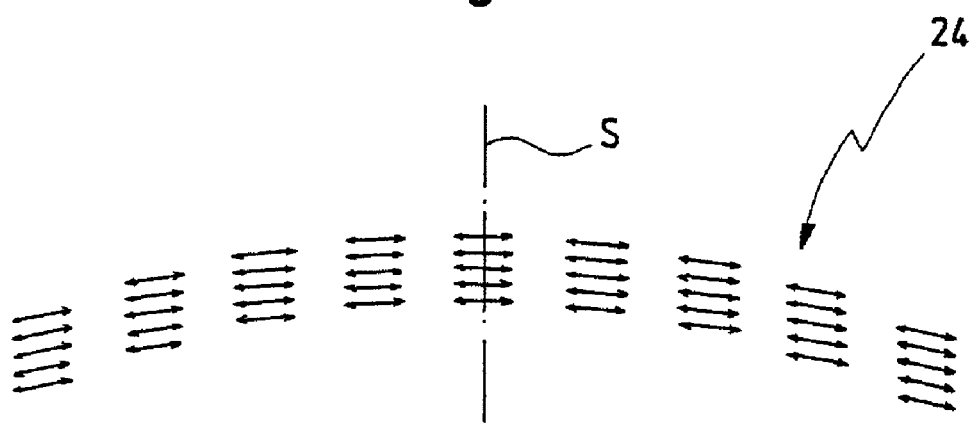

FIG. 2c) illustrates the conditions of symmetrical linear astigmatism that increases linearly with increasing distance from an axis that is perpendicular to the plane of symmetry and intersects the optical axis.

It is true that FIGS. 2a) to c) constitute only idealized field profiles of the field-constant quadratic and linear symmetrical 0° astigmatism. However, it already emerges from the comparison of FIGS. 2a) and 2c) that there is only an insubstantial mutual difference between field-constant astigmatism and linear astigmatism on the field illustrated.

The method according to the invention for correcting the field-constant astigmatism as it is illustrated by way of example in FIG. 2a) is based on using the adjustment of the position of one or more of the mirrors M1 to M6 to produce linear and/or quadratic astigmatism with the aid of which the field-constant astigmatism is at least partially compensated.

Figure 3A:
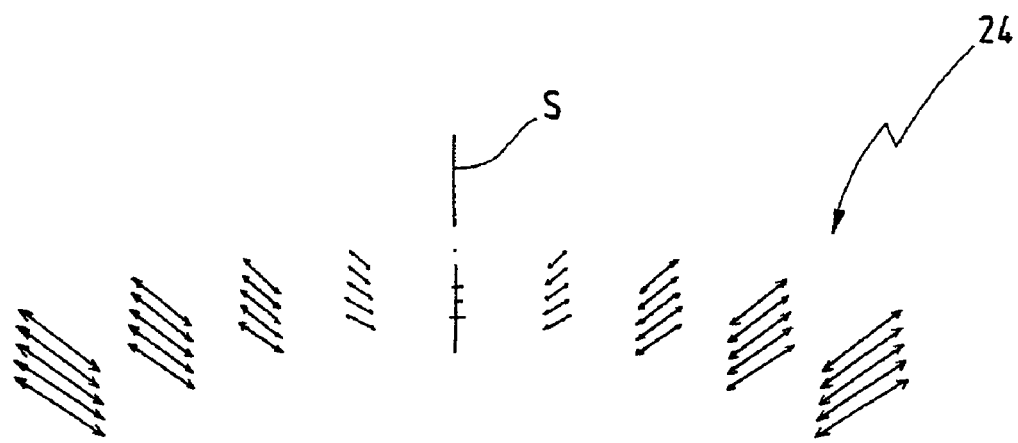
FIG. 3a) to c) show a schematic of the principle of the corrected field-constant symmetrical astigmatism from FIG. 2a), specifically after subtraction of the linear symmetrical component (FIG. 3a)), after subtraction of the quadratic component (FIG. 3b)), and after subtraction of the linear and quadratic components (FIG. 3c))

FIG. 3 illustrates the theoretical result of this method. FIG. 3a) illustrates the formation of the difference from the illustrations in FIG. 2a) and FIG. 2c), that is to say the linear astigmatism in accordance with FIG. 2c) was subtracted from the field-constant astigmatism in accordance with FIG. 2a). It is to be seen that the field-constant astigmatism in the middle of the image, that is to say in the region of the plane of symmetry S is compensated virtually completely, and still remains present only toward the edge of the image field 24. However, there, as well, the field-constant astigmatism is substantially reduced by comparison with FIG. 2a) (another scale of illustration was selected in the illustration in FIG. 3a)). The maximum value of the astigmatism in the edge region of the field region 24 is 0.44 nm, and is thus only 44% of the astigmatism in FIG. 2a).

Figure 3B:
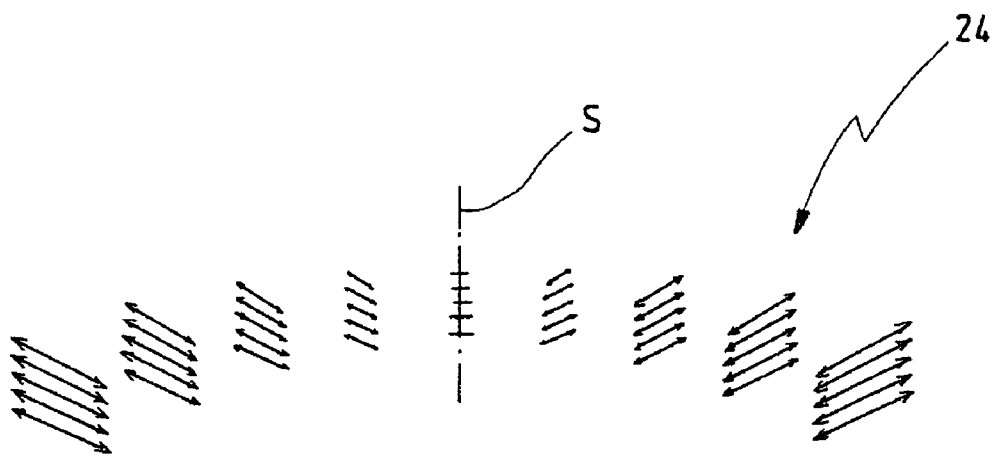

FIG. 3b) shows the field-constant 0° astigmatism in accordance with FIG. 2a) after subtraction of the quadratic astigmatism according to FIG. 2b). The compensation of the field-constant astigmatism only by means of a quadratic astigmatism is, however, worse than the compensation of the field-constant astigmatism by means of a linear astigmatism. The maximum value of the astigmatism in accordance with FIG. 3b) (the longest arrows in the edge region of the field region 24 in FIG. 3b)) is, specifically, still 0.8 of the maximum value in FIG. 2a), that is to say only a reduction to approximately 80% of the field-constant astigmatism is achieved.

Figure 3C:
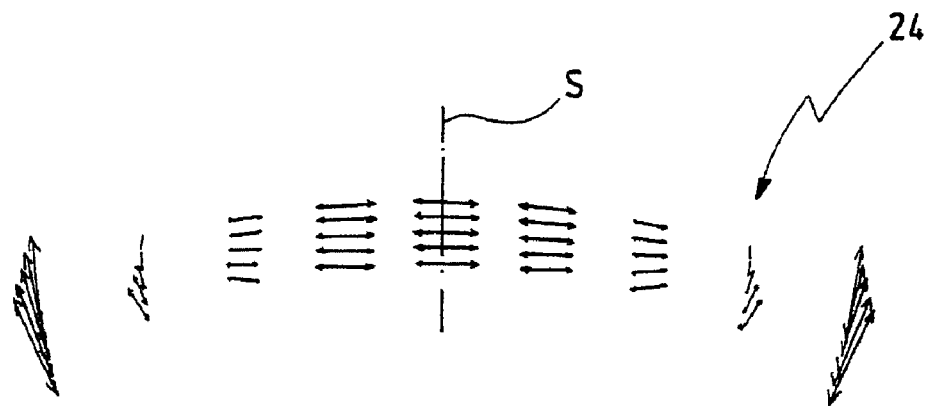

FIG. 3c) shows the field-constant 0° astigmatism after compensation both by the linear astigmatism and by the quadratic astigmatism. The best results are obtained thereby. The maximum value of the astigmatism in FIG. 3c) is only 0.12, that is to say the field-constant astigmatism can be reduced to approximately 12% with the aid of this compensation method.

Symmetrical linear astigmatism is preferably produced in the case of the present method by virtue of the fact that one or more of the mirrors M1 to M6 are tilted about a tilting axis that is perpendicular to the plane of symmetry S, and/or by parallel displacement, that is to say decentering, of at least one or more of the mirrors M1 to M6 along an axis in the plane of symmetry S, as described above.

Symmetrical quadratic astigmatism is preferably induced by displacing at least one element along the optical axis O. It follows therefrom that the field-constant astigmatism can be reduced to a value of approximately 10% of the initial value with the aid only of two degrees of freedom of a positional adjustment, one for producing the linear astigmatism, and one for producing quadratic astigmatism. However, the field-constant astigmatism can be reduced to below 50% even with one degree of freedom of a positional adjustment, with the aid of which linear astigmatism is produced.

Whereas previously with reference to FIGS. 2 and 3 a compensation method for the symmetrical field-constant 0° astigmatism has been described with the aid of idealized field profiles, with reference to FIG. 4 idealized field profiles of an asymmetric field-constant 45° astigmatism and correction thereof by means of producing a linear astigmatism are described.

Figure 4A:
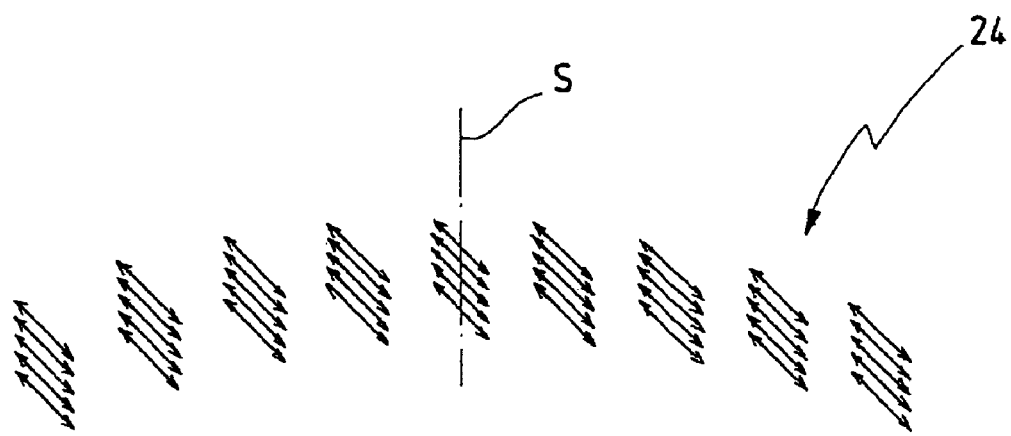
FIG. 4a to c) show idealized field profiles of a field-constant asymmetric astigmatism in an off-axis image field (FIG. 3a)), of an asymmetric linear astigmatism (FIG. 4b)), and of the field-constant asymmetric astigmatism from FIG. 4a) after subtraction of the linear component in accordance with FIG. 3b)

FIG. 4a) shows the ideal field profile of the uncorrected field-constant 45° astigmatism. This astigmatism is not mirror symmetrical with reference to the plane of symmetry S, as is to be seen from FIG. 4a). It is, however, field-constant, since the orientation of the maximally defocused pattern directions, which is illustrated by the orientation of the arrows in FIG. 4a), is constant over the entire field region 24, and is therefore not dependent on location. The astigmatism illustrated in FIG. 4a) is denoted as 45° astigmatism, since the maximally defocused direction of a pattern of the object 14 is inclined by 45° to the plane of symmetry S.

Figure 4B:
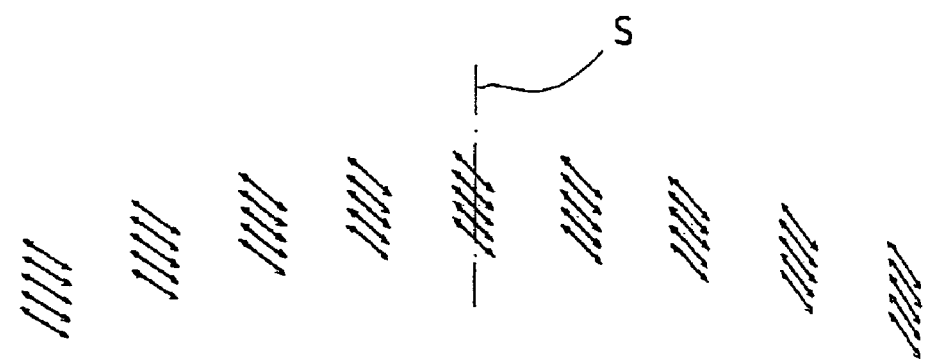

FIG. 4b) shows the ideal profile of the asymmetric linear 45° astigmatism. The length of the arrows in FIG. 4a) and FIG. 4b) is normalized in each case to 1.

Figure 4C:
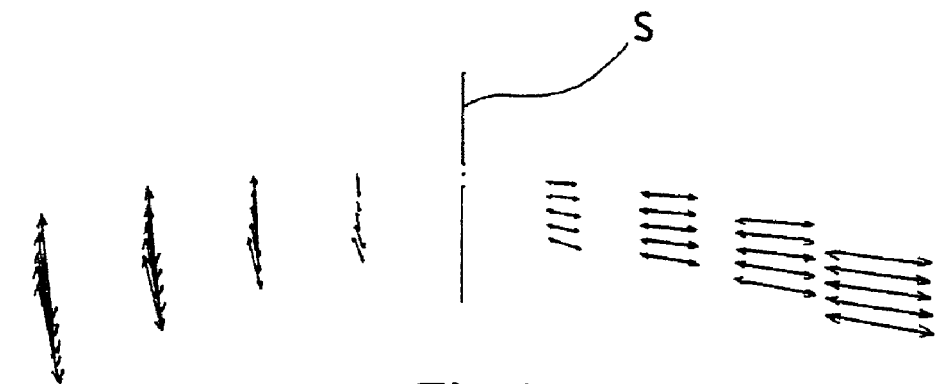

FIG. 4c) shows the formation of the difference from the field-constant astigmatism in accordance with FIG. 4a) and the linear astigmatism in accordance with FIG. 4b).

The maximum value of the length of the arrows in FIG. 4c) (altered scale by comparison with FIG. 4a)) is 0.44 of the maximum value of the arrows in FIG. 4a), and so in other words it is possible to achieve a reduction in the field-constant astigmatism to approximately 44% by subtracting the linear astigmatism in accordance with FIG. 4b) from the field-constant astigmatism in accordance with FIG. 4a).

As has already been described above, in the case of the present method asymmetric linear astigmatism is preferably produced by parallel displacement of one or more of the mirrors M1 to M6 along at least one axis perpendicular to the plane of symmetry S and/or by tilting one or more of the mirrors M1 to M6 about a tilting axis perpendicular to the optical axis O, which lies in the plane of symmetry S.

To the extent that, as described above, symmetrical quadratic astigmatism for correcting the symmetrical field-constant astigmatism is produced by adjusting the position of individual mirrors or number of the mirrors M1 to M6, the imaging can be impaired by a field curvature associated therewith. In order to correct the field curvature on the narrow off-axis image field, it is possible, for example, to tilt the plane of the image 16, or individual ones of the mirrors M1 to M6 and/or the object 14 can be tilted correspondingly in order to correct the field curvature.

It emerges from FIGS. 2 to 4 that the field-constant astigmatism can be reduced to below 50% solely by producing a linear astigmatism, only one degree of freedom of the positional adjustment advantageously being required in order to produce a linear astigmatism.

FIG. 5 illustrates a practical example of a field-constant astigmatism in the case of the projection objective 12.

Figure 5A:
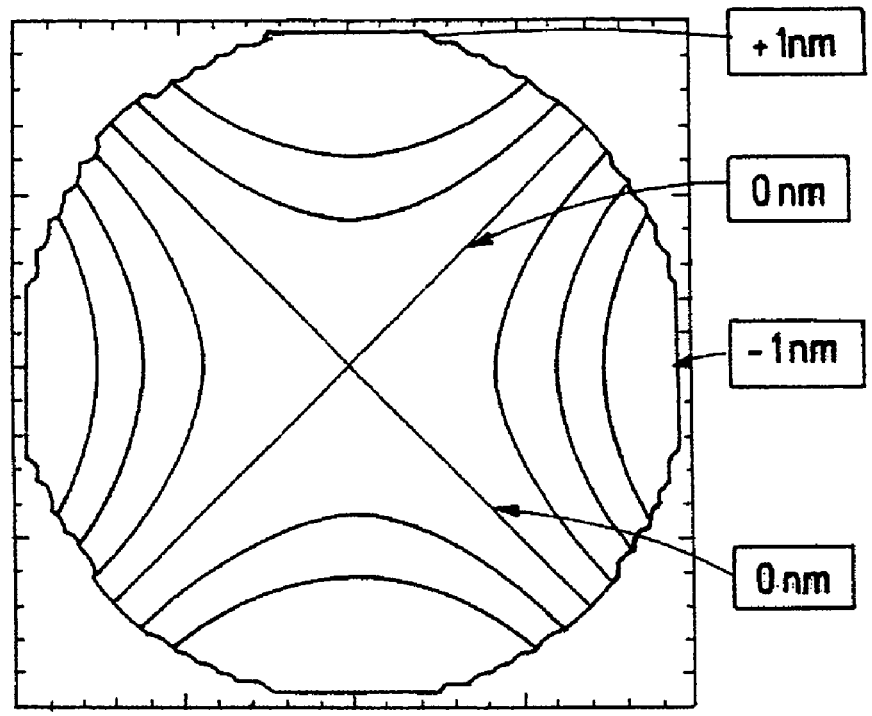
FIGS. 5a) and b) show an example of an optical element with a possible two-fold deformation (FIG. 5a)), and of the field-constant astigmatism caused by the deformation (FIG. 5b))

FIG. 5a shows an image of a near-pupil mirror, for example mirror M6, which is deformed with twofold symmetry. The maximum deformations of the surface of the mirror are ±1 nm compared to the ideal undeformed surface.

Figure 5B:
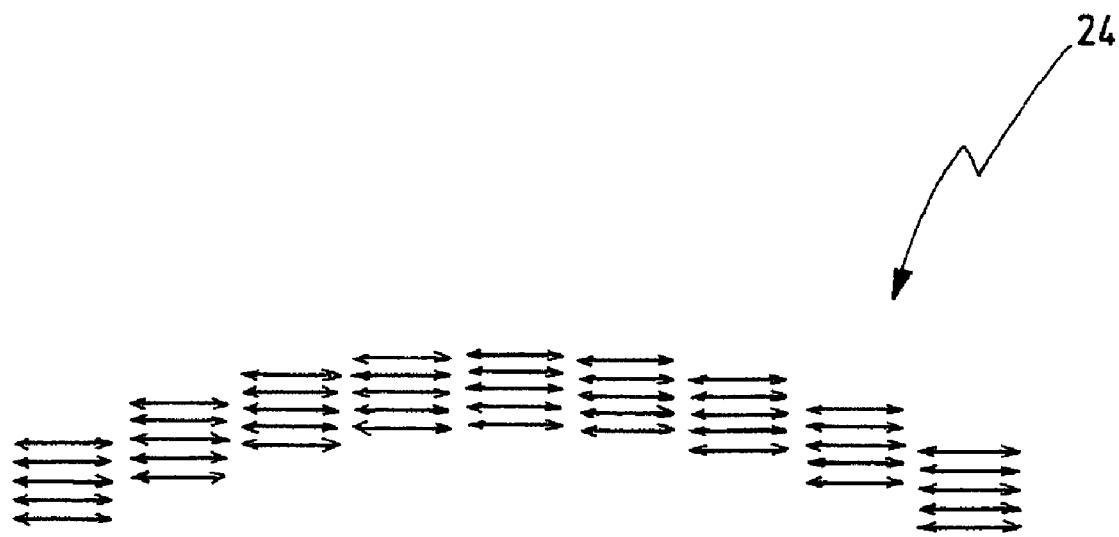

FIG. 5b) shows the field-constant astigmatism caused by the deformation in accordance with FIG. 5a). This field-constant astigmatism is a symmetrical 0° astigmatism in accordance with FIG. 2a). The astigmatism illustrated corresponds to a wavefront error ($Z_5$) of approximately 1.9 nm.

The field-constant astigmatism in accordance with FIG. 5b) can be corrected by adjusting the position of individual mirrors or a number of the mirrors M1 to M6 and/or of the object 14.

The following table 1 specifies preferred examples of possibilities for correcting the field-constant symmetrical astigmatism in accordance with FIG. 5b).

TABLE 1

| Tilting, near-field | Decentering, near-field | Tilting, near-pupil | Decentering, near-pupil | Displace parallel to the optical axis | Residual error ast. (field max. $Z_{5/6}$, referred to uncorr. $Z_{5/6}$) | Other aberrations (largest Zernike coefficient apart from $Z_{5/6}$, referred to uncorr. $Z_{5/6}$) |
|---|---|---|---|---|---|---|
|  |  | M6 |  |  | ≈40% | ≈20% |
|  |  |  | M6 |  | ≈40% | ≈20% |
|  | M4 |  |  |  | ≈40% | ≈30% |
|  |  | M6 |  | M3 | ≈30% | ≈15% |
| M4 |  | M6 |  |  | ≈40% | <10% |
| M3 |  | M6 |  | M4 | ≈40% | <10% |
|  |  | M6 |  |  | ≈40% | ≈10% |
|  |  | M2, M6 |  |  | ≈40% | <10% |
|  |  | M6 |  | M1, M4 | ≈10% | ≈10% |
|  |  | M6 |  | Reticule, M4 | ≈10% | ≈10% |
|  |  | M6 |  | M2, M4 | ≈15% | ≈10% |
|  |  |  | M6 | M4, M6 | ≈15% | ≈20% |
|  |  |  | M6 | M3, M4 | ≈15% | ≈20% |
| M3 | M3 | M2, M6 |  |  | ≈20% | ≈10% |
| M3 | M1, M3 M4 |  |  |  | ≈20% | ≈10% |

In table 1, "tilting, near-field" signifies tilting of a near-field element about a tilting axis perpendicular to the plane of symmetry S, "decentering, near-field" signifies parallel displacement of a near-field element along an axis in the plane of symmetry S, "tilting, near-pupil" signifies tilting of a near-pupil element about a tilting axis perpendicular to the plane of symmetry, and "decentering, near-pupil" signifies parallel displacement of a near-pupil element along an axis in the plane of symmetry S.

"Residual error ast. (field max. $Z_{5/6}$, referred to uncorr. $Z_{5/6}$)" is to be understood as the uncorrected component of the astigmatism (residual error), calculated as maximum value of the Zernike coefficient $Z_{5/6}=\sqrt{Z_5^2+Z_6^2}$ in the image field 24. Serving in each case as reference variable for the % data in table 1 is the value of $Z_{5/6}$ before correction of the field-constant astigmatism.

"Other aberrations (largest Zernike coeff. apart from $Z_{5/6}$, referred to uncorr. $Z_{5/6}$)" is to be understood as the size of the aberrations (Zernike coefficients except for astigmatism) that are additionally produced during correction of the field-constant astigmatism.

It follows from table 1 that even a single degree of freedom of a positional adjustment suffices to reduce the maximum value of the astigmatism to approximately 40% of its initial value, by virtue of the fact that, for example, the mirror M6 is decentered by parallel displacement. The astigmatism is substantially corrected by means of the linear component in the case of correction of the field-constant astigmatism by means of only one degree of freedom.

If a second or third degree of freedom is added, for example a displacement of an element parallel to the optical axis, in order to produce quadratic astigmatism, the astigmatism can even be reduced to only approximately 10%. The addition of a second or third degree of freedom of the positional adjustment of one or more of the optical elements, also of the object, can, moreover, advantageously avoid the production of other aberrations such as, for example, coma, distortion etc.

The parallel displacement of the object (reticle) serves not to produce astigmatism, but to compensate other aberrations, which can be caused by the correction of astigmatism.

Figure 6A:
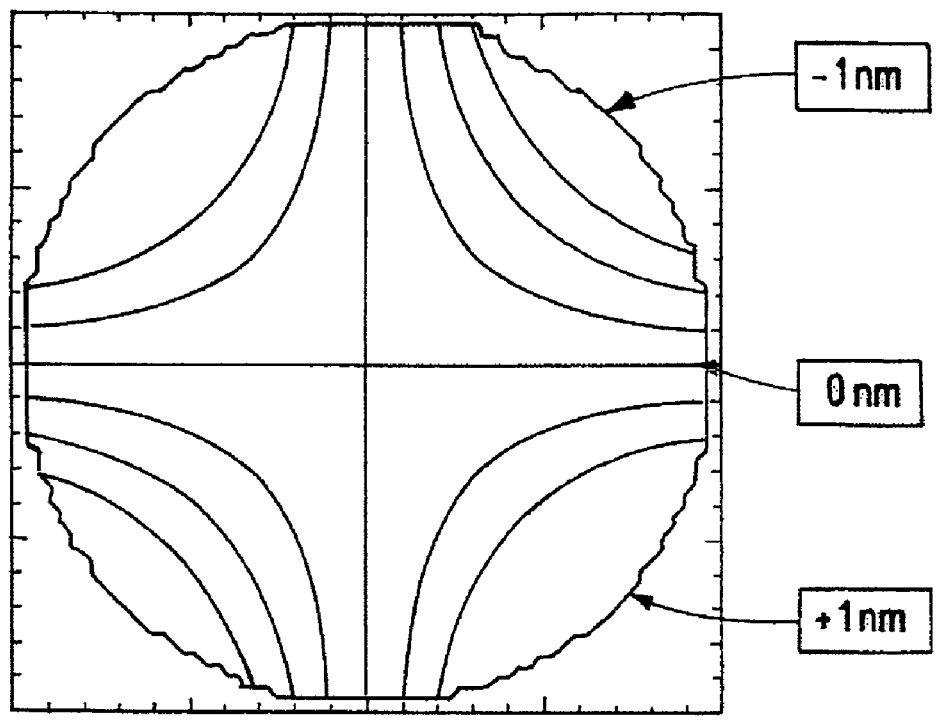
FIGS. 6a) and b) show an illustration, corresponding to FIG. 5, of an optical element with a possible twofold deformation (FIG. 6a)), and of the field-constant asymmetric (45°) astigmatism caused thereby (FIG. 6b)).

FIG. 6 illustrates in a practical case a near-pupil mirror, for example the mirror M6, which has a possible dual wave deformation that causes an asymmetric 45° astigmatism by contrast with FIG. 6*a*).

Figure 6B:

The following table 2 specifies examples of possibilities for correcting the field-constant asymmetric astigmatism in accordance with FIG. 6*b*).

TABLE 2

| Tilting, near-field | Decentering, near-field | Tilting, near-pupil | Decentering, near-pupil | Residual error ast. (field max. $Z_{5/6}$, referred to uncorr. $Z_{5/6}$) | Other aberrations (largest, Zernike coefficient apart from $Z_{5/6}$ referred to uncorr. $Z_{5/6}$) |
|---|---|---|---|---|---|
|  |  | M6 |  | ≈40% | ≈20% |
|  |  |  | M6 | ≈40% | ≈20% |
|  | M4 |  |  | ≈50% | ≈30% |
|  | M1 |  |  | ≈50% | ≈40% |
|  | M3 |  |  | ≈50% | ≈40% |
|  | M4 |  | M6 | ≈40% | <10% |
| M4 |  | M6 | M6 | ≈40% | <10% |
|  | M4 |  |  | ≈40% | <10% |
| M4 |  |  |  | ≈40% | <10% |
|  | M3 | M6 |  | ≈40% | ≈10% |
|  | M3 | M2, M6 |  | ≈40% | <10% |
| M4 | M1, M4 | M2 |  | ≈25% | ≈10% |
| M4 | M3, M4 | M2 |  | ≈25% | ≈10% |

In table 2, "tilting, near-field" signifies tilting of a near-field element about a tilting axis perpendicular to the optical axis O, which lies in the plane of symmetry S, "decentering, near-field" signifies parallel displacement of a near-field optical element along an axis perpendicular to the plane of symmetry S, "tilting, near-pupil" signifies tilting of a near-pupil optical element about a tilting axis perpendicular to the optical axis O, which lies in the plane of symmetry S and "decentering, near-pupil" signifies parallel displacement of a near-pupil element along an axis perpendicular to the plane of symmetry S.

Since quadratic astigmatism is not suitable for correcting an asymmetric field-constant astigmatism, there is here no parallel displacement of one or more optical elements parallel to the optical axis O.

With reference to the explanation of columns 5 and 6 in table 2, reference may be made to the previous explanations relating to the columns 6 and 7 of table 1.

It is also possible without restricting the general concept even to make use for the purpose of correcting the field-constant asymmetric astigmatism of four degrees of freedom of the adjustment of the position of optical elements, in order further to reduce the residual error of the asymmetric field-constant astigmatism.

The previously described paths of tilting or parallel displacement are limited to small positioning travels that are of the order of magnitude of μrad or μm or below, although without the invention being restricted thereto.

In the case of a method for the microlithographic production of micropatterned components in the course of which a layer made from a light-sensitive material is applied to the substrate 16 in FIG. 1, a patterning present on object 14 in the form of a reticle is imaged by means of the projection objective 12 of the projection exposure apparatus 10. Before or during the exposure of the light-sensitive material on the substrate 16, the previously described astigmatism correction method is carried out after the astigmatism of the projection objective 12 has been measured in advance.

What is claimed is:

1. A method for correcting a field-constant astigmatism of a projection objective of a microlithography projection exposure apparatus, said projection objective having an arrangement of a plurality of optical elements that images at least a part of an object onto an off-axis image field lying outside at least one optical axis, said arrangement of said plurality of optical elements having a plane of symmetry that is defined by said at least one optical axis and a center of said image field, the method for correcting said field-constant astigmatism comprising an adjustment of position of at least one element of said plurality of optical elements in such a way that at least one of a linear and quadratic astigmatism is generated that at least partially compensates said field-constant astigmatism.

2. The method of claim 1, wherein said adjustment of position serves the purpose of generating a linear astigmatism and comprises at least a tilting of said at least one element about a tilting axis that runs at least approximately perpendicular to said plane of symmetry.

3. The method of claim 1, wherein said adjustment of position serves the purpose of generating a linear astigmatism and comprises at least a parallel displacement of said at least one element along at least one axis that lies in said plane of symmetry.

4. The method of claim 1, wherein said adjustment of position serves the purpose of generating a linear astigmatism and comprises at least a parallel displacement of said at least one element along an axis that runs at least approximately perpendicular to said plane of symmetry.

5. The method of claim 1, wherein said adjustment of position serves the purpose of generating a linear astigmatism and comprises at least a tilting of said at least one element about a tilting axis that runs at least approximately perpendicular to said at least one optical axis and lies at least approximately in said plane of symmetry.

6. The method of claim 1, wherein the correction of said field-constant astigmatism comprises an adjustment of position of at least one element selected from the group consisting of said at least one optical element of said plurality of optical elements and said object, this being done in such a way that a quadratic astigmatism is generated in said off-axis image field region.

7. The method of claim 6, wherein said adjustment of position comprises a parallel displacement of said at least one element along said at least one optical axis.

8. The method of claim 1, wherein said at least one element whose position is adjusted is at least one near-field optical element of said plurality of optical elements.

9. The method of claim 1, wherein said at least one element whose position is adjusted is at least one near-pupil optical element of said plurality of optical elements.

10. The method of claim 1, wherein said at least one element whose position is adjusted is said object.

11. A method for the microlithographic fabrication of micropatterned components, comprising the steps of:
providing a substrate to which there is applied at least partially a layer made from a light-sensitive material;
providing a reticle that has features to be imaged;
providing a projection exposure apparatus that has a projection objective, said projection objective having an arrangement of a plurality of optical elements that images at least a part of said reticle onto an off-axis image field lying outside at least one optical axis, said arrangement of said plurality of optical elements having a plane of symmetry that is defined by said at least one optical axis and a center of said image field;
measuring an astigmatism of said projection objective;
correcting a field-constant astigmatism of said projection objective by adjusting a position of at least one element of said plurality of optical elements in such a way that at least one of a linear and quadratic astigmatism is, generated that at least partially compensates said field-constant astigmatism; and
projecting at least a part of said reticle onto a region of said layer of said substrate by means of said projection exposure apparatus.

12. A micropatterned component that is produced using a method, comprising the steps of:
providing a substrate to which there is applied at least partially a layer made from a light-sensitive material;
providing a reticle that has features to be imaged;
providing a projection exposure apparatus that has a projection objective, said projection objective having an arrangement of a plurality of optical elements that images at least a part of said reticle onto an off-axis image field lying outside at least one optical axis, said arrangement of said plurality of optical elements having a plane of symmetry that is defined by said at least one optical axis and a center of said image field;
measuring an astigmatism of said projection objective;
correcting a field-constant astigmatism of said projection objective by adjusting a position of at least one element of said plurality of optical elements in such a way that at least one of a linear and quadratic astigmatism is generated that at least partially compensates said field-constant astigmatism; and
projecting at least a part of said reticle onto a region of said layer of said substrate by means of said projection exposure apparatus.

13. A projection objective of a microlithography projection exposure apparatus, comprising an arrangement composed of a plurality of optical elements that serves the purpose of imaging at least a part of an object onto an off-axis image field lying outside at least one optical axis, wherein said arrangement of said plurality of optical elements has a plane of symmetry that is defined by said at least one optical axis and a center of said image field, wherein at least one element of said plurality of optical elements is assigned at least one actuator for adjusting a position of said at least one element in such a way that at least one of a linear and quadratic astigmatism can be generated in order to at least partially compensate a field-constant astigmatism in said off-axis image field region.

14. The projection objective of claim 13, wherein said optical elements are mirrors.

15. The projection objective of claim 14, wherein said arrangement of said plurality of optical elements has six mirrors.

16. The projection objective of claim 15, wherein at least one near-pupil mirror of said mirrors is assigned said at least one actuator, and wherein said at least one near-pupil mirror is at least one of the second and sixth mirror seen in the direction of the propagation of light from said object to said image plane.

17. The projection objective of claim 15, wherein at least one near-field mirror of said mirrors is assigned said at least one actuator, and wherein said at least one near-field mirror is at least one of the first, third and fourth mirror seen in the direction of the propagation of light from said object to said image plane.

18. The projection objective of claim 15, wherein at least one element of said plurality of optical elements is assigned at least one actuator for a parallel displacement of said element parallel to said at least one optical axis, and wherein said optical element is at least one of the first, third and fourth mirror seen in the direction of the propagation of the light from said object to said image plane.

19. The projection objective of claim 13, wherein at least one near-pupil optical element of said plurality of optical elements is assigned at least one actuator for tilting said optical element about a tilting axis perpendicular to at least one of said at least one optical axis and said plane of symmetry.

20. The projection objective of claim 13, wherein at least one near-pupil optical element is assigned at least one actuator for a parallel displacement of said optical element along an axis which lies in said plane of symmetry.

21. The projection objective of claim 13, wherein at least one near-pupil optical element is assigned at least one actuator for a parallel displacement of said optical element along an axis perpendicular to said plane of symmetry.

22. The projection objective of claim 13, wherein at least one near-field optical element is assigned at least one actuator for tilting said optical element about a tilting axis perpendicular to at least one of said at least one optical axis and said plane of symmetry.

23. The projection objective of claim 13, wherein at least one near-field optical element is assigned at least one actuator for a parallel displacement of the optical element along an axis perpendicular to said plane of symmetry.

24. The projection objective of claim 13, wherein at least one near-field optical element is assigned at least one actuator for a parallel displacement of the optical element along an axis lying in said plane of symmetry.

25. The projection objective of claim 13, wherein at least one element of said plurality of optical elements and said object is assigned at least one actuator for a parallel displacement of said element parallel to said at least one optical axis.

* * * * *

UNITED STATES PATENT AND TRADEMARK OFFICE
CERTIFICATE OF CORRECTION

PATENT NO. : 7,522,260 B1  Page 1 of 1
APPLICATION NO. : 11/239266
DATED : April 21, 2009
INVENTOR(S) : Andreas Kirchner et al.

It is certified that error appears in the above-identified patent and that said Letters Patent is hereby corrected as shown below:

On the Title page should read,

Item (75) Inventors: Andreas Kirchner, Böbingen (DE)

Signed and Sealed this

Thirtieth Day of June, 2009

JOHN DOLL
*Acting Director of the United States Patent and Trademark Office*